US006682960B1

(12) United States Patent
Mochizuki

(10) Patent No.: US 6,682,960 B1
(45) Date of Patent: *Jan. 27, 2004

(54) METHOD OF PRODUCING SEMICONDUCTOR DEVICE WITH A THIN FILM TRANSISTOR AND A PHOTOELECTRIC CONVERSION ELEMENT

(75) Inventor: Chiori Mochizuki, Sagamihara (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 29 days.

(21) Appl. No.: 08/964,797

(22) Filed: Nov. 5, 1997

(30) Foreign Application Priority Data

Nov. 7, 1996 (JP) .............................. 8-294949

(51) Int. Cl.[7] .............................. H01L 21/00
(52) U.S. Cl. .................. 438/149; 438/151; 438/57; 438/59
(58) Field of Search .............. 438/57, 60, 149, 438/151; 297/136

(56) References Cited

U.S. PATENT DOCUMENTS

| 5,591,963 | A |   | 1/1997 | Takeda et al. ........... 250/214.1 |
| 5,777,335 | A | * | 7/1998 | Mochizuki et al. ..... 250/370.09 |
| 5,811,790 | A | * | 9/1998 | Endo et al. .............. 250/208.1 |

OTHER PUBLICATIONS

Stanley Wolf Ph.D. and Richard N. Tauber Ph.D. in Silicon Processing for the VLSI Era, vol. 1: Process Technology, pp. 529–531, Lattice Press, 1986.*

* cited by examiner

Primary Examiner—Olik Chaudhuri
Assistant Examiner—William M. Brewster
(74) Attorney, Agent, or Firm—Fitzpatrick, Cella, Harper & Scinto

(57) ABSTRACT

The present invention is a method of producing a semiconductor device usable as a photodetector having a plurality of pixels, each composed of an MIS photoelectric conversion element and a switching TFT. Each MIS photoelectric conversion element has a first electrode layer, an insulating layer, a photoelectric conversion semiconductor layer, a barrier layer for preventing carriers from entering the photoelectric conversion semiconductor layer, and a second electrode layer formed on an insulating substrate in that order. Each switching TFT has a first electrode layer, an insulating layer, a semiconductor layer, an ohmic contact layer for the semiconductor layer, and a second electrode layer formed on the same insulating substrate in that order. This method includes a step for forming source and drain electrodes of each TFT and removing portions of at least the ohmic contact layer each corresponding to the TFT channel of each TFT using the same mask pattern, and a step for forming the upper electrode of each photoelectric conversion element using another mask pattern. Therefore, without shifts caused by mask misalignment, the resulting device has stable characteristics.

18 Claims, 6 Drawing Sheets

METHOD OF PRODUCING SEMICONDUCTOR DEVICE WITH A THIN FILM TRANSISTOR AND A PHOTOELECTRIC CONVERSION ELEMENT

BACKGROUND OF THE INVENTION

1. Field of the Invention

The present invention relates to a method for producing a semiconductor device, such as a photodetector in which elements, including photoelectric conversion elements and thin-film transistors (hereinafter referred to as "TFTs"), are formed on the same substrate. More particularly, the present invention relates to a method for producing a semiconductor device represented by a photodetector used for a one- or two-dimensional image-reading device in a facsimile machine, a digital copying machine, or a scanner, or for detecting radiation (e.g., X-rays or γ-rays) converted to light in the photosensitive wavelength range of the photodetector by a fluorescent plate.

2. Description of the Related Art

Conventionally, reduction optical systems and reading systems using CCD sensors have been employed for facsimile machines, digital copying machines, and radiation detectors. However, recently, with the development of photoelectric conversion semiconductor materials such as amorphous silicon (hereinafter referred to as "a—Si film"), contact type linear sensors have been investigated and put into practical use, in which the sensor's photoelectric conversion elements are formed on a large substrate so as to read information without reducing the size of the information.

In particular, when employing the a—Si films, semiconductor layers in photoelectric conversion elements and switching TFTs can be advantageously formed at the same time because the a—Si films can be used not only for the photoelectric conversion material but also for the semiconductor material for the switching TFTs.

FIG. 1 is a cross-sectional diagram illustrating a PIN optical sensor as an example of optical sensors employing the a—Si films. There are shown a glass substrate 101, a lower electrode 102, a p-type semiconductor layer (hereinafter referred to as "p layer") 103, an i-type semiconductor layer (hereinafter referred to as "i layer") 104, an n-type semiconductor layer (hereinafter referred to as "n layer") 105, and a transparent electrode 106.

FIG. 2 is a circuit diagram of the PIN optical sensor shown in FIG. 1. There are shown a PIN optical sensor 110, a power source 111, and an output circuit 112 such as a current amplifier. The C and A sides shown in FIG. 2 correspond to the sides of the transparent electrode 106 and the lower electrode 102 of FIG. 1, respectively. The voltage applied to the C side by the power source 111 is set to positive with respect to that of the A side.

The basic operation of the PIN optical sensor 110 will be briefly described with reference to FIGS. 1 and 2.

As is shown in FIG. 1, when light enters the i layer 104 from the direction shown by the arrow L in FIG. 1, the incident light is photoelectrically converted and creates electrons and holes. Due to an electric field applied to the i layer 104 by the power source 111, the electrons move toward the C side, in other words, pass through the n layer 105 to the transparent electrode 106, and the holes move towards the A side, in other words, the holes are transferred to the lower electrode 102. A photoelectric current thereby flows in the optical sensor 110.

If no light enters the optical sensor 110, no electrons and holes are generated in the i layer 104. Since the n layer 105 serves as a barrier for holes in the transparent electrode 106 and the p layer 103 functions as a barrier for electrons in the lower electrode 102, neither the electrons nor the holes can move and no photoelectric current flows in the optical sensor 110. Based on the above mechanism, the current in the circuit changes with the presence and absence of incident light. Such changes in the current are measured by the output circuit 112 shown in FIG. 2, and thus the optical sensor 110 detects incident light.

However, employing a PIN optical sensor such as shown in FIG. 1, it is difficult to achieve a photodetector having a high S/N ratio at a low cost, for the following reasons:

The first reason is that PIN optical sensors require barrier layers, i.e., p and n layers.

In the PIN optical sensor of FIG. 1, the n layer 105 must facilitate the movement of electrons to the transparent electrode 106, and simultaneously, must prevent holes from entering the i layer 104. If the n layer 105 does not exhibit one of these characteristics, the resulting photoelectric current decreases or a dark current, i.e., a current flowing when no light enters the optical sensor, appears or increases, causing a reduction in the S/N ratio.

In general, to improve the above characteristics of the n layer 105, it is necessary to optimize various conditions such as the film-forming conditions for the i layer 104 and the n layer 105 and heat-treatment conditions after film-forming.

Meanwhile, the p layer 103 must facilitate the movement of holes to the lower electrode 102, and simultaneously, must prevent electrons from entering the i layer 104. Thus, similarly to the n layer 105, various conditions for the i layer 104 and the p layer 103 must be optimized. In general, the conditions required for optimizing the n layers and those for the p layers are not the same, and thus it is very difficult simultaneously to satisfy the required conditions for the n layers and the p layers. In other words, it is difficult to produce an optical sensor having a high S/N ratio because two types of barrier layers, i.e., the p and n layers, are required to be formed in the same optical sensor.

The second reason will be explained with reference to FIG. 3. FIG. 3 is a cross-sectional diagram illustrating a switching TFT which is used in a controlling section for a photodetector. There are shown a glass substrate 101, a lower electrode 102, a gate insulating film 107, an i layer 104, an n layer 105, and upper electrodes (i.e., source and drain electrodes) 160.

The switching TFT is fabricated as follows: the lower electrode 102 functioning as a gate electrode G, the gate insulating film 107, the i layer 104, the n layer 105, and the upper electrode 160 are formed on a glass substrate 101 in the above order; the upper electrode 160 is formed into the source and drain electrodes by etching; and then, a portion of the n layer 105 is removed to form a channel 170. Since the characteristics of the switching TFT are largely affected by the conditions of the interface between the gate insulating film 107 and the i layer 104, in general, the above film-forming process is continuously carried out under a vacuum or without the workpiece being exposed to air.

If the PIN optical sensor shown in FIG. 1 is made on the same substrate on which the switching TFT is formed, production cost increases and the characteristics deteriorate. This is attributed to the differences in layer structures of the PIN optical sensor having the electrode, the p layer, the i layer, the n layer, and the electrode formed on the substrate in that order and the switching TFT having the electrode, the insulating layer, the i layer, the n layer, and the electrode formed on the substrate in that order. In other words, the PIN optical sensors and the switching TFTs cannot be formed simultaneously by the same process. Thus, the fabrication process becomes complicated such that film-forming steps and photolithographic steps are repeated for forming the required layers in the required regions, resulting in a decreased yield, higher cost, etc.

For example, when the PIN optical sensors and the switching TFTs can employ the same i layer and n layer, it is possible continuously to form the gate insulating layer and the p layer, remove portions of the p layer in the regions of the respective switching TFTs, and continuously form the i layer and the n layer, thus simplifying the fabrication process. However, the interface between the gate insulating film and the i layer, which interface is important for the switching TFT characteristics, and the interface between the p layer and the i layer in each PIN optical sensor are sometimes contaminated, resulting in deteriorated characteristics and a decreased S/N ratio.

Furthermore, if capacitors, required for obtaining the integral of the electrical charge or current generated by the PIN optical sensors, have the same structure as that of the PIN optical sensor of FIG. 1, the capacitors cannot have excellent characteristics and low leakage. This is because although a capacitor must have a barrier between two electrode layers so as to prevent both electrons and holes from moving, the semiconductor layers in the PIN optical sensor of FIG. 1 cannot sufficiently prevent movement of electrons and holes; thus an excellent capacitor with low leakage cannot be achieved.

As is mentioned above, when switching TFTs or capacitors, both of which are important elements for a photodetector, cannot be produced by the same process as that for photoelectric conversion elements, or if their characteristics do not match those of photoelectric conversion elements, the whole fabrication process inevitably becomes complicated and results in a reduction in yield.

In particular, the above fact causes a great problem in achieving a multi-functional and high-performance photodetector at low cost which sequentially detects optical signals from a plurality of optical sensors arranged one- or two-dimensionally.

SUMMARY OF THE INVENTION

Accordingly, an object of the present invention is to provide a method for producing a semiconductor device usable as a photodetector, by which method photoelectric conversion elements, each having a high S/N ratio and stable characteristics, and switching TFTs can be formed by the same process.

Another object of the present invention is to provide a method for producing a semiconductor device usable as a photodetector, by which method a photodetector having a high S/N ratio and composed of photoelectric conversion elements and switching TFTs can be produced at low cost. In this method, each of the photoelectric conversion elements is composed of a first electrode layer, an insulating layer, a photoelectric conversion semiconductor layer, a barrier layer for preventing carriers from entering the photoelectric conversion semiconductor layer, and a second electrode layer so that the photoelectric conversion elements and the switching TFTs can be produced by the same simplified process.

Another object of the present invention is to provide a method for producing a semiconductor device usable as a photodetector, by which method misaligning due to replacement of masks is avoidable because a single mask can be used for the step for forming the source and drain electrodes of switching TFTs, and for the step for removing portions of an ohmic contact layer corresponding to switching TFT channels. Thus, compact TFTs having excellent characteristics can be achieved accurate in size, and also, a semiconductor device usable as a photodetector can be produced with an improved aperture ratio.

Still another object of the present invention is to provide a method of producing a high-performance semiconductor device usable as a photodetector, according to which method elements of the device readily acquire higher performance and uniform characteristics.

Another object of the present invention is to provide a method of producing semiconductor devices at an improved yield, according to which method elements having higher performance and uniform characteristics can be produced by a decreased number of steps without complicating the steps.

An object of the present invention is to provide a method for producing a semiconductor device composed of a plurality of pixels in each of which a photoelectric conversion element having an upper electrode and a TFT having source and drain electrodes are monolithically formed on the same substrate. According to the invention, such method includes: a step for forming the source and drain electrodes of the TFT and removing a portion of at least an ohmic contact layer in a channel region of the TFT using a first mask pattern; and a step for forming the upper electrode of the photoelectric conversion element using a second mask pattern which is different from the first mask pattern.

Another object of the present invention is to provide a method for producing a semiconductor device having a plurality of pixels, in each of which at least a photoelectric conversion element having an upper electrode and a switching TFT having source and drain electrodes are monolithically formed. According to the invention, such method includes: a first step for forming a first electrode layer using a first mask pattern; a second step for forming an insulating layer, a semiconductor layer, and an n+ type semiconductor layer in that order; a third step for making a contact hole for each of the pixels using a second mask pattern; a fourth step for forming at least a second electrode layer to be formed into the source and drain electrodes of the switching TFT and removing a portion of the n+ type semiconductor layer of each of the pixels using a third mask pattern; a fifth step for forming a third electrode layer other than the source and drain electrodes using a fourth mask pattern; and a sixth step for separating the pixels and separating the photoelectric conversion element and the switching TFT in each of the pixels using a fifth mask pattern.

Still another object of the present invention is to provide a method for producing a semiconductor device having a plurality of pixels, in each of which at least a photoelectric conversion element having an upper electrode and a switching TFT having source and drain electrodes are monolithically formed. According to the invention, such method comprises: a first step for forming a first electrode layer using a first mask pattern; a second step for forming an insulating layer, a semiconductor layer, and an n+ type semiconductor layer in that order; a third step for making a contact hole for each of the pixels using a second mask pattern; a fourth step for forming a second electrode layer other than the source and drain electrodes using a fourth mask pattern; a fifth step for forming at least a third electrode layer to be formed into the source and drain electrodes of the switching TFT and removing a portion of the n+ type semiconductor layer of each of the pixels using a third mask pattern; and a sixth step separating the pixels and separating the photoelectric conversion element and the switching TFT in each of the pixels using a fifth mask pattern.

According to the present invention, photodetectors having a high S/N ratio can be achieved at low cost by a simplified method in which photodetectors are composed of a plurality of pixels each having an MIS photoelectric conversion element having a first electrode layer, an insulating layer, a photoelectric conversion semiconductor layer, a barrier layer for preventing carriers from entering the photoelectric conversion semiconductor layer, and a second electrode layer formed on an insulating substrate in that order, and a switching TFT having a first electrode layer, an insulating layer, a semiconductor layer, an ohmic contact layer for the semiconductor layer, and a second electrode layer formed on the same insulating substrate in that order.

When employing a method for producing photodetectors in which photoelectric conversion elements, each having an upper electrode, and TFTs, each having source and drain electrodes, are monolithically formed on the same substrate, different masks are conventionally used for patterning the upper electrode of each photoelectric conversion element, for patterning the second electrode layer of each TFT, and for removing portions of the ohmic contact layer each corresponding to a TFT channel of each TFT, respectively. Thus, the portions of the ohmic contact layer each corresponding to the TFT channel are removed by patterning, after patterning the second electrode. Meanwhile, according to a method of the present invention, formation of the source and the drain electrodes of each TFT and removal of the portions of at least the ohmic contact layer each corresponding to the TFT channel of each TFT are carried out by one step using one mask, and formation of the upper electrode of each photoelectric conversion element is performed by another step using another mask. Therefore, it becomes unnecessary to consider the shift caused by misaligning the mask used for forming the source and the drain electrodes and that used for removing the portions of the ohmic contact layer corresponding to the TFT channels, and in particular, margins conventionally set for the TFTs corresponding to the width of the source and the drain electrodes are not required, resulting in more compact TFTs with an improved aperture ratio.

DETAILED DESCRIPTION OF THE PREFERRED EMBODIMENTS

Further objects, features and advantages of the present invention will become apparent from the following description of the preferred embodiments with reference to the attached drawings. Although each figure shows one pixel composed of an optical sensor and a TFT, it goes without saying that the present invention is applied to photodetectors having a plurality of such pixels arranged one- or two-dimensionally.

First Embodiment

The first method for producing a two-dimensional photodetector will be explained following the order of the processing steps. FIGS. 4A to 4G are cross-sectional diagrams each showing a step for fabricating a photodetector. FIGS. 5A to 5E show examples of mask patterns used in those processing steps. Shaded portions in FIGS. 5A to 5E shade light when a positive photoresist is used and transmit light when a negative photoresist is used.

Figure 1:
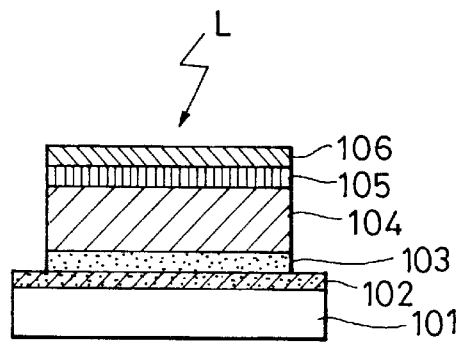
FIG. 1 is a cross-sectional diagram illustrating a conventional PIN optical sensor employing the a—Si films.
Figure 2:
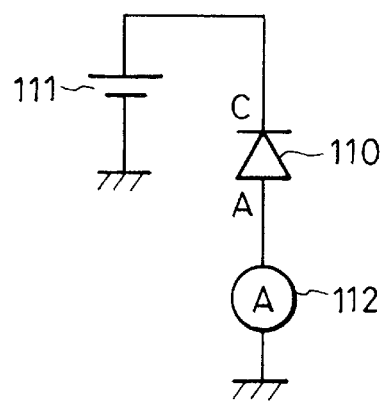
FIG. 2 is a circuit diagram of the PIN optical sensor shown in FIG. 1.
Figure 3:
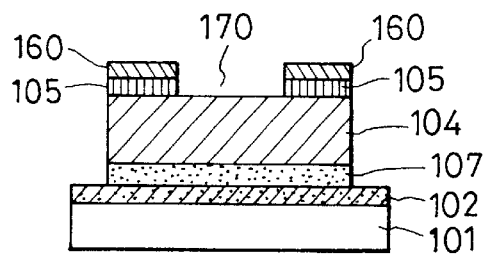
FIG. 3 is a cross-sectional diagram illustrating a switching TFT.
Figure 4A:
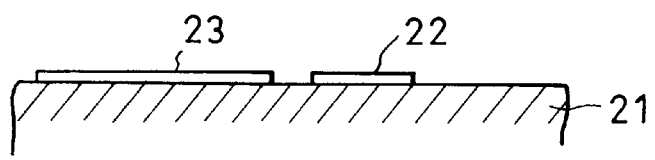
FIGS. 4A to 4G are cross-sectional diagrams each showing a processing step of the first embodiment of the present invention.
Figure 5E:
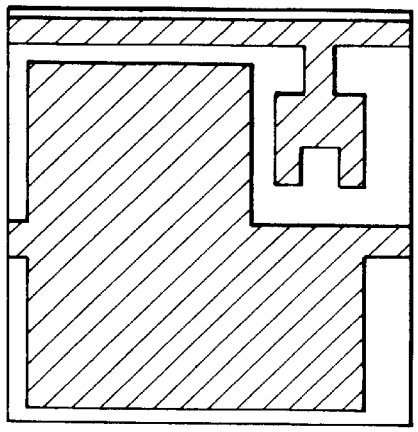
FIGS. 5A to 5E are examples of mask patterns used in the processing steps of the first embodiment of the present invention.
Figure 5C:
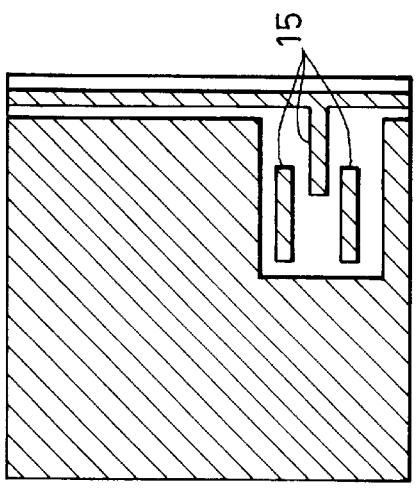
Figure 5D:
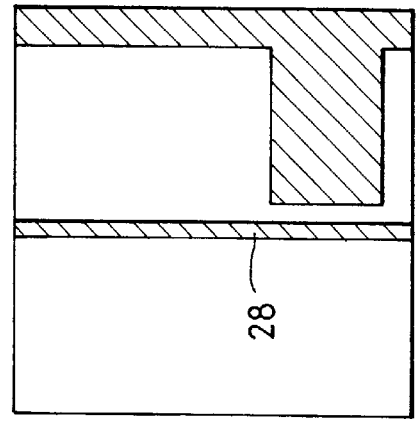
Figure 5A:
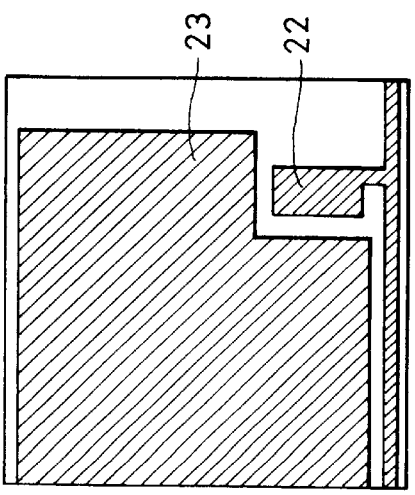

In the first step, as is shown in FIG. 4A, a Cr film 1,000 Å thick is sputtered onto a glass substrate 21 (e.g., OA-2 produced by Nippon Electric Glass Co., Ltd.), and then, a gate electrode 22 of a switching TFT and a lower electrode 23 of an optical sensor are formed by a photolithographic method using the first mask, having the pattern shown in FIG. 5A.

Figure 4B:
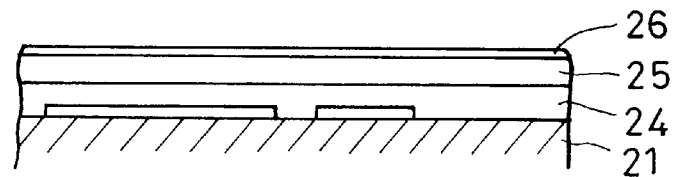

In the second step, a 3,000 Å thick SiN film 24, as a gate insulating film of the switching TFT, a 5,000 Å thick a—Si film 25, as a photoelectric conversion layer of the optical sensor and a semiconductor layer of the switching TFT, and a 1,000 Å thick n+ film 26, as a carrier barrier layer of the optical sensor and an ohmic contact layer of the switching TFT, are successively formed by a plasma CVD method, as is shown in FIG. 4B.

Figure 4C:
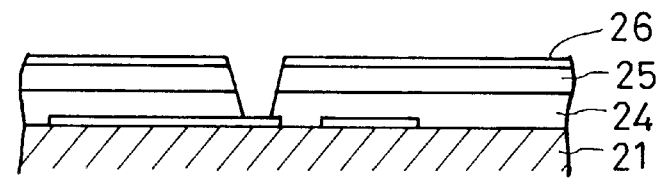
Figure 5B:
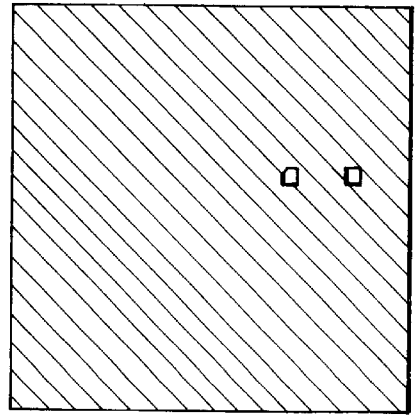

In the third step, as is shown in FIG. 4C, a contact hole is made such that a predetermined pattern is formed by a photolithographic method using the second mask, having the pattern shown in FIG. 5B, followed by processing according to a CDE method.

Figure 4D:
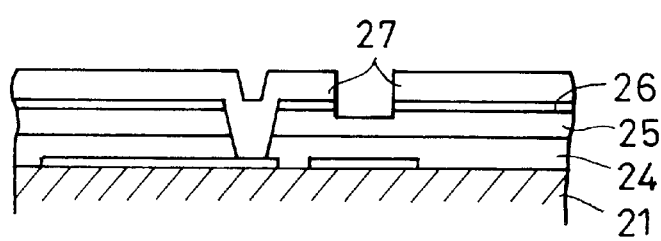

In the fourth step, as is shown in FIG. 4D, a 1 µm thick Al film 27 is formed by sputtering. Source and drain electrodes 15 of the switching TFT are then formed by etching the Al film 27 according to a photolithographic method using the third mask, having the pattern shown in FIG. 5C. After that, using the same mask pattern, a portion of the n+ film 26 and of the a—Si film 25 both corresponding to the switching TFT channel are reduced by 1,000 Å (i.e., the full thickness) and approximately 200 Å, respectively, by etching according to an RIE method. Portions 15 of the mask pattern shown in FIG. 5C correspond to the source and drain electrodes 15 of the switching TFT in FIG. 4D.

Figure 4E:
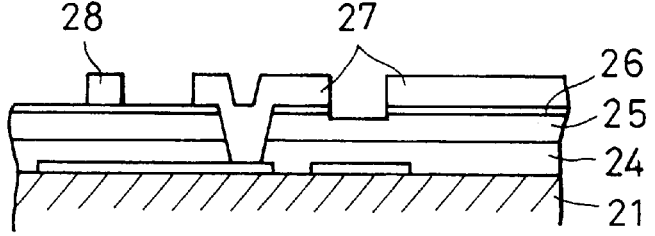

In the fifth step, as is shown in FIG. 4E, upper electrode wiring 28 of the optical sensor is formed by etching a portion of the Al film 27 in the optical sensor region by the photolithographic method using the fourth mask, having the pattern shown in FIG. 5D. A portion 28 of the mask pattern shown in FIG. 5D corresponds to the upper electrode wiring 28 of the optical sensor in FIG. 4E.

Figure 4F:
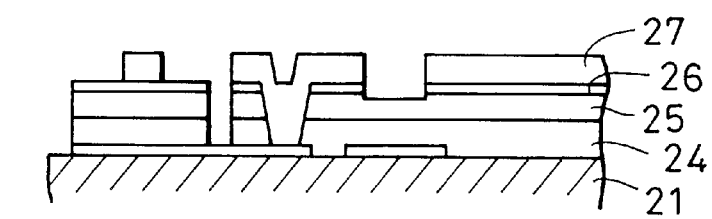

In the sixth step, as is shown in FIG. 4F, a predetermined pattern is formed by a photolithographic method using the fifth mask, having the pattern shown in FIG. 5E. The n+ film 26, the a—Si film 25, and the SiN film 24 are then etched by a single RIE step so as to separate the photoelectric conversion element and the switching TFT, and also, to separate the pixel from adjacent pixels.

Figure 4G:
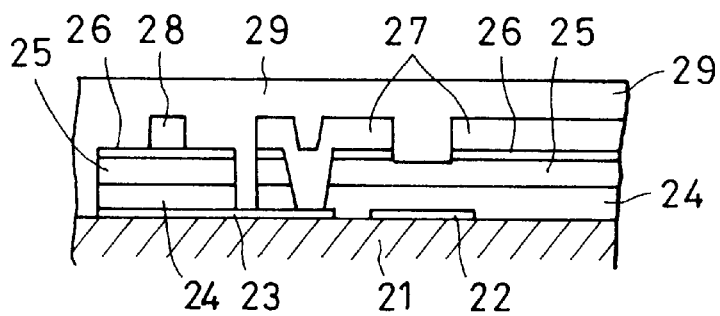

In the seventh step, as is shown in FIG. 4G, another SiN film is provided as a passivation film 29 by the plasma CVD method, and then is formed into a predetermined pattern using a sixth mask, whose pattern is not shown in the figures, followed by etching according to the RIE method so as to remove unnecessary portions such as leading portions for wiring (not shown in the figures).

Figure 6:
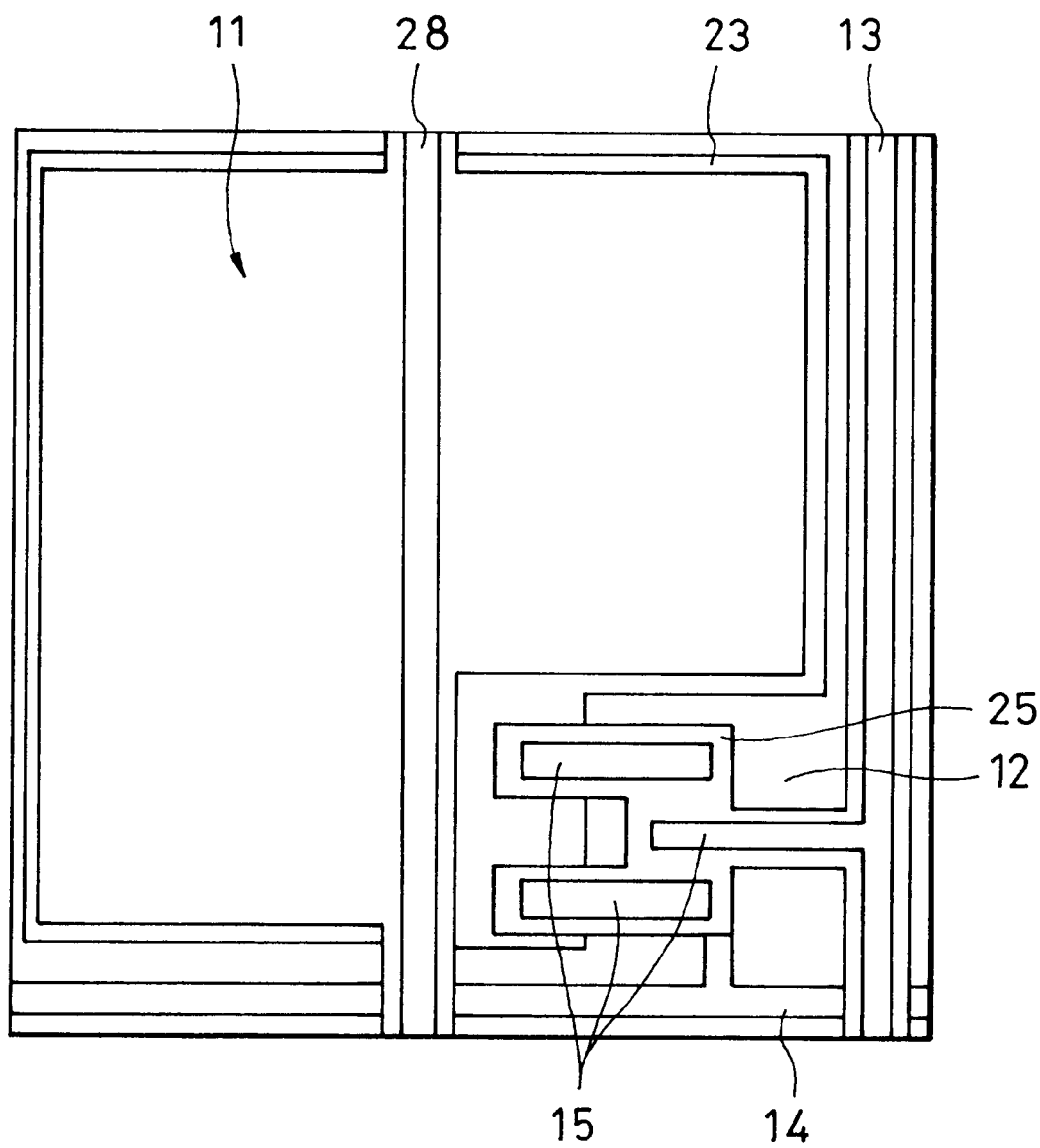
FIG. 6 is a plan diagram showing a semiconductor device of the first embodiment of the present invention.

FIG. 6 is a plan diagram showing a photodetector produced by the above process. There are shown an MIS sensor portion 11, a switching TFT portion 12, signal wiring 13, gate wiring 14, and upper electrode wiring 28 of the optical sensor. A protective layer is omitted from FIG. 6.

As is above mentioned, according to this embodiment, the Al film 27 is etched by using two masks having different patterns, i.e., a mask for forming the electrodes of the switching TFT and a mask for forming the upper electrode wiring 28 of the optical sensor. The n+ film 26 left on the sensor portion is thereby allowed to remain unexposed until formation of the upper electrode of the optical sensor. When the upper electrode of the sensor is prepared simultaneously with the formation of the switching TFT electrode, it is necessary to protect the n+ film in the sensor portion from being removed while removing unnecessary n+ film from the switching TFT portion. However, according to the present invention, no protection step is required because the n+ film in the sensor portion is not exposed.

In addition, since formation of the switching TFT electrode and removal of unnecessary n+ film can be carried out by using one mask or by one exposure, shift caused by misaligning a plurality of masks is preventable.

Furthermore, the number of steps in which the n+ film in the sensor portion is exposed can be reduced.

Therefore, the thus-produced elements exhibit very little or no variation in their characteristics and readily achieve the desired characteristics.

Second Embodiment

A method for producing semiconductor devices applicable to X-ray detectors using a wavelength converter, such as a fluorescent plate, converting radiation to visual rays will be explained in the second embodiment.

Figure 7A:
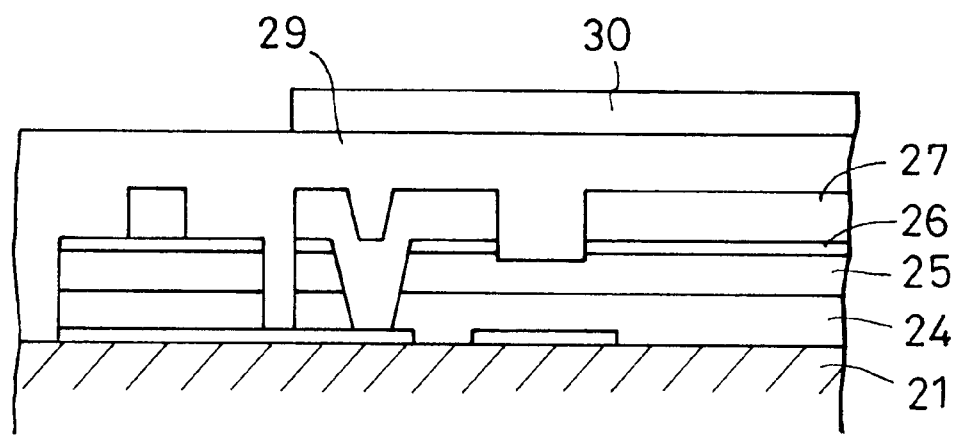
FIGS. 7A and 7B are cross-sectional diagrams each showing a processing step of the second embodiment of the present invention.
Figure 8:
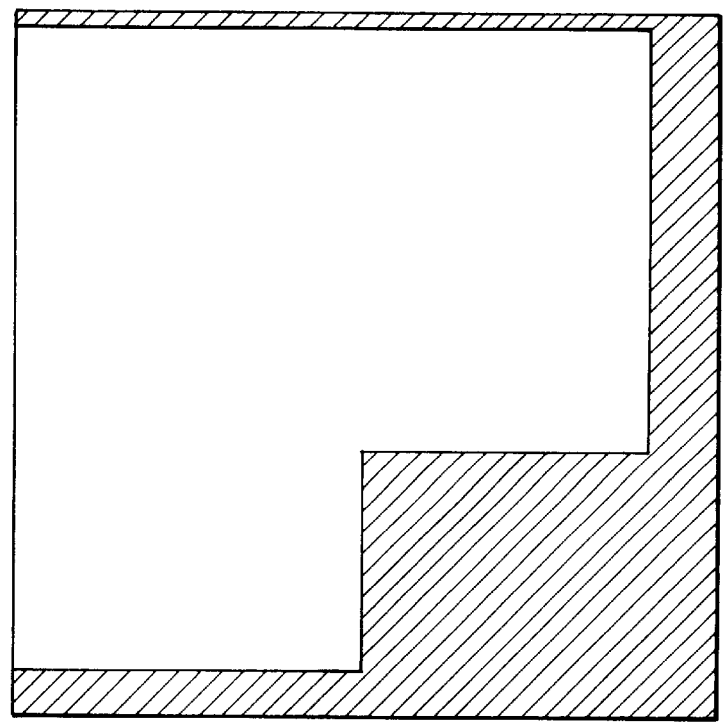
FIG. 8 is an example of a mask pattern used in the second embodiment of the present invention.

Since the first to the sixth steps are carried out similarly to those of the first embodiment, their description need not be repeated. The seventh to the ninth steps will be described below:

In the seventh step, as is shown in FIG. 7A, an SiN film is provided as a passivation film 29 at the incident light side by the plasma CVD method, and then, a red-colored filter 30, as a shading film, is formed into a predetermined pattern such as a switching TFT using the sixth mask, having the pattern shown in FIG. 8.

In the eighth step, after masking unnecessary portions such as a leading portion for wiring (not shown in the figures), a polyimide resin (not shown in the figures) is applied and used as a mask for etching the SiN film 29 by the RIE method.

Figure 7B:
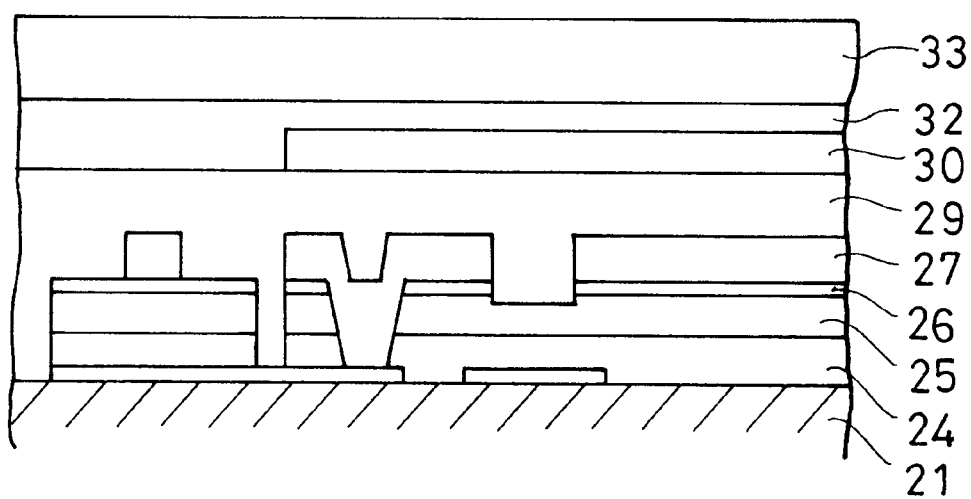

In the ninth step, as is shown in FIG. 7B, a fluorescent plate 33 is laminated with an adhesive 32 such as an epoxy.

Considering the wavelength range of the light emitted from the fluorescent plate 33, the filter 30 is colored red in this embodiment. However, since the filter 30 is used for preventing the light from the fluorescent plate 33 from reaching undesired portions such as the switching TFT, the color of the filter 30 is not limited to red, and other dark colors such as black can be also employed, as long as the resulting filter can satisfactorily decrease the amount of transmitted light. In this embodiment, green light is emitted from the fluorescent plate 33, thus the filter 30 is colored in red which is a complementary color of green.

According to this embodiment, the resulting elements uniformly exhibit the desired characteristics; therefore, they can photoelectrically convert the light, emitted from the fluorescent plate corresponding to the amount of the incident light such as X-rays, and then, can efficiently output the result.

Third Embodiment

Figure 9A:
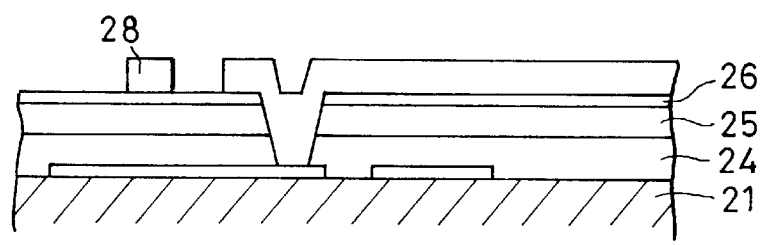
FIGS. 9A and 9B are cross-sectional diagrams each showing a processing step of the third embodiment of the present invention.

A method for producing a semiconductor device of the third embodiment is similar to that of the first embodiment, except that the order of the fourth step and the fifth step is reversed. In other words, a 1 μm thick Al film 27 is formed by sputtering in the fourth step of the third embodiment, as is shown in FIG. 9A. An upper electrode 28 of the optical sensor is then formed by a photolithographic method using the fourth mask, having the pattern shown in FIG. 5D.

Figure 9B:
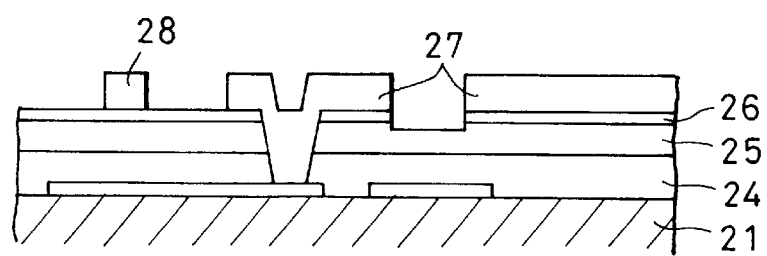

In the fifth step of the third embodiment, as is shown in FIG. 9B, source and drain electrodes of the switching TFT are formed by etching the Al film 27 according to a photolithographic method using the third mask, having the pattern of FIG. 5C. A portion of the n+ film 26 and that of the a—Si film 25 both corresponding to the switching TFT channel are reduced by 1,000 Å (i.e., the full thickness) and approximately 200 Å, respectively, by etching according to an RIE method.

In the third embodiment, although the n+ film in the sensor region is exposed at first, formation of the switching TFT electrodes and removal of unnecessary n+ film can be performed by one mask and one exposure. Thus, the shift caused by misaligning a plurality of masks is preventable and the resulting switching TFT exhibits excellent switching characteristics. Therefore, the whole device achieves satisfactorily excellent characteristics with an improved yield.

Even when the above-mentioned formation of the switching TFT electrodes and removal of unnecessary n+ film are carried out by separate exposures, the shift caused by mask misalignment can be avoided or minimized.

As is mentioned above, according to the present invention, each of the photoelectric conversion elements is composed of a first electrode layer, an insulating layer, a photoelectric conversion semiconductor layer, a barrier layer for preventing carriers from entering the photoelectric conversion semiconductor layer, and a second electrode layer. Thus, the photoelectric conversion elements and the switching TFTs are produced according the same simplified process. As a result, a photodetector having a high S/N ratio can be achieved at low cost.

According to the present invention, a single mask can be used for the step for forming the source and the drain electrodes of switching TFTs, and for the step for removing portions of the ohmic contact layer corresponding to switching TFT channels. Thus, misaligning due to replacement of masks is avoidable. As a result, compact TFTs having excellent characteristics can be achieved accurate in size, and also, a photodetector with an improved aperture ratio can be produced.

Furthermore, according to the present invention, elements having higher performance and uniform characteristics can be readily achieved, resulting in high-performance semiconductor devices usable as photodetectors.

Moreover, according to the present invention, elements having higher performance and uniform characteristics can be produced by a decreased number of steps without complicating the steps, resulting in an improved yield.

It is to be understood that the present invention is not restricted to the above embodiments, and variations and modifications can be effected within the spirit and scope of the present invention.

What is claimed is:

1. A method for producing a semiconductor device comprising a plurality of pixels, in each of which a photoelectric conversion element comprising an upper electrode and a TFT comprising source and drain electrodes are formed on the same substrate, comprising:
    a first step, of forming the source and drain electrodes of the TFT, and forming a channel region of the TFT by removing a portion of at least an ohmic contact layer using a first mask pattern, while protecting to the ohmic contact layer of the photoelectric conversion element; and
    a second step, of forming the upper electrode of the photoelectric conversion element using a second mask pattern, that is different from the first mask pattern, while protecting the source and drain electrodes and the space between the source and drain electrodes.

2. A method for producing a semiconductor device as set forth in claim 1, further comprising a step for forming a wavelength converter on the light-incident side of the photoelectric conversion element.

3. A method for producing a semiconductor device as set forth in claim 2, wherein the wavelength converter comprises a fluorescent body.

4. A method for producing a semiconductor device as set forth in claim 1, further comprising a step for forming a shading member on the light-incident side of the TFT.

5. A method for producing a semiconductor device as set forth in claim 4, further comprising a step for forming a wavelength converter on the light-incident side of the shading member.

6. A method for producing a semiconductor device comprising a plurality of pixels, in each of which at least one photoelectric conversion element comprising an upper electrode and a switching TFT comprising source and drain electrodes are formed, comprising:
    a first step, of forming a first electrode layer using a mask pattern A;
    a second step, of forming an insulating layer, a semiconductor layer, and an n$^+$ type semiconductor layer, in that order;
    a third step, of forming a contact hole for each of the pixels, using a mask pattern B;
    a fourth step, of forming an electrode layer and then forming the source and drain electrodes of the switching TFT by removing a portion of the electrode layer, and then removing a portion of the n$^+$ type semiconductor layer between the source and drain electrodes of the switching TFT of each of the pixels, while protecting the upper electrode and the n$^+$ type semiconductor layer of the photoelectric conversion element using a mask pattern C;
    a fifth step, of forming the upper electrode of the photoelectric conversion element, while protecting the source and drain electrodes and the portion of the n$^+$ type semiconductor layer between the source and drain electrodes of the switching TFT, using a mask pattern D; and
    a sixth step, of separating the pixels and separating the photoelectric conversion element and the switching TFT in each of the pixels using a mask pattern E.

7. A method for producing a semiconductor device as set forth in claim 6, further comprising a step for forming a wavelength converter on the light-incident side of the photoelectric conversion element.

8. A method for producing a semiconductor device as set forth in claim 7, wherein the wavelength converter comprises a fluorescent body.

9. A method for producing a semiconductor device as set forth in claim 6, further comprising a step for forming a shading member on the light-incident side of the switching TFT.

10. A method for producing a semiconductor device as set forth in claim 9, further comprising a step for forming a wavelength converter on the light-incident side of the shading member.

11. A method for producing a semiconductor device as set forth in claim 6, wherein the second electrode layer comprises upper electrode wiring of the photoelectric conversion element.

12. A method for producing a semiconductor device comprising a plurality of pixels, in each of which at least one photoelectric conversion element comprising an upper electrode and a switching TFT comprising source and drain electrodes are formed, comprising:
    a first step, of forming a first electrode layer, using a mask pattern A;
    a second step, of forming an insulating layer, a semiconductor layer, and an n$^+$ type semiconductor layer, in that order;
    a third step, of making a contact hole for each of the pixels, using a mask pattern B;
    a fourth step, of forming an electrode layer and then forming the upper electrode by removing a portion of the electrode layer, while protecting the electrode layer arranging on the switching TFT including the source and drain electrodes using a mask pattern C;
    a fifth step, of forming the source and drain electrodes of the switching TFT, removing at least a portion of the electrode layer, and then removing a portion of the n$^+$ type semiconductor layer between the source and the drain electrodes of each of the pixels, while protecting the n$^+$ type semiconductor layer of the photoelectric conversion element using a mask pattern D; and
    a sixth step, of separating the pixels and separating the photoelectric conversion element and the switching TFT in each of the pixels using a mask pattern E.

13. A method for producing a semiconductor device as set forth in claim 12, further comprising a step for forming a wavelength converter on the light-incident side of the photoelectric conversion element.

14. A method for producing a semiconductor device as set forth in claim 13, wherein the wavelength converter comprises a fluorescent body.

15. A method for producing a semiconductor device as set forth in claim 12, further comprising a step for forming a shading member on the light-incident side of the switching TFT.

16. A method for producing a semiconductor device as set forth in claim 15, further comprising a step for forming a wavelength converter on the light-incident side of the shading member.

17. A method for producing a semiconductor device as set forth in claim 12, wherein the third electrode layer comprises upper electrode wiring of the photoelectric conversion element.

18. A method for producing a semiconductor device comprising a plurality of pixels, each comprising a photoelectric conversion element having a semiconductor layer and an upper electrode provided on the semiconductor layer separated by an $n^+$ type semiconductor layer of the photoelectric conversion element, and a TFT having a semiconductor layer and source and drain electrodes provided on the semiconductor layer separated by an $n^+$ type semiconductor layer of the TFT, comprising:

step A, of forming the source and drain electrodes of the TFT while protecting the $n^+$ type semiconductor layer of the photoelectric conversion element;

step B, of forming the upper electrode of the photoelectric conversion element while protecting the source and drain electrodes and the portion between the source and drain electrodes of the TFT; and step C, of removing the $n^+$ semiconductor layer in a channel region between the source and drain electrodes of the TFT, wherein said step A and said step C are performed using the same mask pattern.

* * * * *

UNITED STATES PATENT AND TRADEMARK OFFICE
CERTIFICATE OF CORRECTION

PATENT NO. : 6,682,960 B1
DATED : January 27, 2004
INVENTOR(S) : Chiori Mochizuki It is certified that error appears in the above-identified patent and that said Letters Patent is hereby corrected as shown below:

Column 9,
Line 22, "to the" should read -- the --.

Signed and Sealed this

Thirteenth Day of July, 2004

JON W. DUDAS
*Acting Director of the United States Patent and Trademark Office*